United States Patent [19]

Uchida et al.

[11] Patent Number: 4,725,331

[45] Date of Patent: Feb. 16, 1988

[54] PROCESS FOR PRODUCING TIN OXIDE FIBERS

[75] Inventors: Kenji Uchida; Eisuke Bannai, both of Sakura, Japan

[73] Assignee: National Institute for Researches in Inorganic Materials, Niihari, Japan

[21] Appl. No.: 885,441

[22] Filed: Jul. 14, 1986

Related U.S. Application Data

[63] Continuation of Ser. No. 647,656, Sep. 6, 1984, Pat. No. 4,623,424.

[30] Foreign Application Priority Data

Sep. 7, 1983 [JP] Japan ................................. 58-164764
Feb. 1, 1984 [JP] Japan ................................. 59-17596
Jul. 4, 1984 [JP] Japan ................................. 59-138571
Jul. 10, 1984 [JP] Japan ................................. 59-142800

[51] Int. Cl.$^4$ ............................................. C30B 23/00
[52] U.S. Cl. ........................... 156/610; 156/DIG. 110; 156/DIG. 112; 423/618
[58] Field of Search ..... 156/610, 621, 624, DIG. 110, 156/DIG. 112; 423/618; 252/364

[56] References Cited

U.S. PATENT DOCUMENTS 4,623,424 11/1986 Uchida et al. ........................ 156/610

OTHER PUBLICATIONS

Schwartz; Composite Materials Handbook, McGraw-Hill Book Co., New York, 1984.
Kunkle et al.; Flux Growth of Stannic Oxide Crystals; J. Apply. Phys. 36(4), Apr. 1965, p. 1489.

*Primary Examiner*—Barry S. Richman
*Assistant Examiner*—Michael S. Gzybowski
*Attorney, Agent, or Firm*—Oblon, Fisher, Spivak, McClelland & Maier

[57] ABSTRACT

A process for producing tin oxide fibers, which comprises forming a melt comprising a solute composed essentially of tin oxide and a solvent selected from the group consisting of copper, a copper alloy, tin or a tin alloy, evaporating the solute from the melt, and introducing the evaporated solute to a low temperature zone, whereby tin oxide fibers are permitted to precipitate and grow in the low temperature zone.

9 Claims, No Drawings

PROCESS FOR PRODUCING TIN OXIDE FIBERS

This is a continuation of application Ser. No. 647,656, filed Sep. 6, 1984, now U.S. Pat. No. 4,623,424.

BACKGROUND OF THE INVENTION

1. Field of The Invention

The present invention relates to a process for producing tin oxide fibers.

2. Description of The Prior Art

Tin oxide is highly durable against acids and alkaline materials, and also stable against heat. Therefore, if such tin oxide can be formed into fibers, such fibers are expected to be useful as chemically resistant and heat resistant fibers, and it is also expected that such tin oxide is applicable as electrically conductive fibers.

Heretofore, there has been known no method which is capable of producing a substantial amount of fine tin oxide fibers having uniform diameters.

SUMMARY OF THE INVENTION

It is an object of the present invention to provide a process whereby it is possible to obtain fine tin oxide fibers having uniform diameters in a substantial amount.

The present inventors have conducted extensive researches to attain the above object, and have found it possible to obtain fine tin oxide fibers by forming a melt comprising a solute of tin oxide and a solvent of copper, a copper alloy, tin or a tin alloy, evaporating tin oxide as the solute from the melt, and introducing the evaporated tin oxide to a low temperature zone thereby to permit the tin oxide precipitate and grow. The present invention has been accomplished based on this discovery.

Thus, the present invention provides a process for producing tin oxide fibers, which comprises forming a melt comprising a solute composed essentially of tin oxide and a solvent selected from the group consisting of copper, a copper alloy, tin or a tin alloy, evaporating the solute from the melt, and leading the evaporated solute to a low temperature zone, whereby tin oxide fibers are permitted to precipitate and grow in the low temperature zone.

It has also been found that by incorporating into the solute of tin oxide a metal or metal oxide to increase the electrical conductivity of tin oxide, it is possible to obtain electrically conductive tin oxide fibers.

Now, the present invention will be described in detail with reference to the preferred embodiments.

DETAILED DESCRIPTION OF THE INVENTION

The ratio of the solute to the solvent is not critical since tin oxide may or may not completely be dissolved in the solvent such as copper. However, it is preferred that the weight ratio of the solute to the solvent in the melt is from 20:80 to 2:98.

The solute is composed essentially of tin oxide. In a preferred embodiment, however, the solute further contains a metal or metal oxide to increase the electrical conductivity of tin oxide, whereby the resulting tin oxide fibers will have excellent electrical conductivity. As such a metal or metal oxide, there may be mentioned antimony, vanadium, indium, iridium or their oxides. Such a metal or metal oxide may be incorporated in an amount of upto 30% by weight, preferably from 2 to 5% by weight, relative to the total solute.

The solvent is selected from the group consisting of copper, a copper alloy, tin or a tin alloy. The copper alloy is preferably an alloy of copper with a metal, such as tin or zinc, which lowers the melting point of copper. Likewise, the tin alloy is preferably an alloy of tin with a metal, such as copper or zinc, which raises or lowers the melting point of tin. Thus, when such an alloy is employed, it is possible to adjust the melting point by selecting the type or amount of the metal in the copper or tin alloy.

A mixture of the solute and the solvent put in a heat resistant vessel such as a crucible is heated in a furnace such as an electric furnace in a non-oxidizing atmosphere such as an inert gas (e.g. nitrogen) atmosphere or an atmosphere with an oxygen partial pressure being sufficiently low to avoid oxidation of the solvent. Then, the melt is further heated to a temperature higher than the temperature at which tin oxide starts to evaporate, whereby tin oxide is evaporated. When the solute contains a metal or metal oxide to increase the electrical conductivity, such a metal or metal oxide will be included in the evaporated tin oxide. The temperature for the evaporation is adjusted depending upon the amount of the evaporation and is usually within a range of from 400° to 1400° C. The evaporated solute is then led to a low temperature zone provided in the furnace. The temperature of the low temperature zone is kept at a temperature lower than the temperature of the melt, e.g. at a temperature lower by from 50° to 500° C. than the temperature of the melt. When the evaporation is continued under these conditions for at least one day, tin oxide fibers precipitate and grow in the low temperature zone The low temperature zone may be formed by blowing a low temperature gas to such a zone or by circulating a cooling medium such as water to such a zone.

The tin oxide as the starting material may be stannous oxide, stannic oxide or a mixture thereof. In any case, the resulting fibers will be stannic oxide fibers. When a metal or metal oxide to increase the electrical conductivity is incorporated in the tin oxide as the starting material, electrically conductive stannic oxide fibers doped with some particular metal oxide, such as antimony oxide will be obtained.

Now, the present invention will be described in further detail with reference to Examples. However, it should be understood that the present invention is by no means restricted by these specific Examples.

EXAMPLE 1

Four g of stannic oxide having a purity of 99.99% and 100 g of copper having a purity of 99.99% were mixed. The mixture was placed in a Tamman tube. This Tamman tube was placed in an electric furnace which is capable of controlling the ambient gas. Nitrogen gas was supplied from the top of the electric furnace at a rate of some 10 liters per minute to create a low temperature zone at the upper portion of the Tamman tube made of alumina. The temperature of the electric furnace was raised to 1250° C. at a rate of 50° C./hr, whereby the mixture was melted. The system was maintained under these conditions for 20 days, whereby tin oxide fibers precipitated at the low temperature zone in the Tamman tube. Twenty days later, the temperature was gradually lowered to room temperature, and the tin oxide fibers were taken out.

The temperature at the low temperature zone was about 1000° C.

The tin oxide fibers thereby obtained had a diameter of at most 0.5 μm and a length of about 3 mm.

In a similar manner, tin oxide fibers were likewise obtainable when a copper alloy (Cu-Sn) (Cu: 50 wt.%) was used instead of copper.

EXAMPLE 2

Four g of stannic oxide having a purity of 99.99%, 0.5 g of antimony pentoxide having a purity of 99.99% and 100 g of copper having a purity of 99.99% were mixed. This mixture was placed in a Tamman tube. The Tamman tube was placed in an electric furnace capable of controlling the ambient gas. Nitrogen gas was supplied from the top of the electric furnace at a rate of some 10 liters per minute to create a low temperature zone at the upper portion of the Tamman tube. The temperature of the electric furnace was raised to 1250° C. at a rate of 50° C./hr, whereby the mixture was melted. The system was maintained under these conditions for 20 days, whereby tin oxide fibers precipitated at the low temperature zone in the Tamman tube. Twenty days later, the temperature was gradually lowered to room temperature, and the tin oxide fibers were taken out.

The temperature at the low temperature zone was about 1000° C.

The tin oxide fibers thereby obtained had a diameter of at most 0.5 μm and a length of 3 mm. In a similar manner, tin oxide fibers were likewise obtainable when a copper alloy (Cu-Sn) (Cu: 50 wt.%) was used instead of copper

EXAMPLE 3

Fifteen g of stannous oxide of 99.99% purity, and 100 g of tin having a purity of 99.99% were mixed. An alumina boat containing the above mixture was introduced into an alumina reaction tube which had been placed in a horizontal electric furnace. The boat was laid at the spot of the highest temperature gradient of the furnace. The ratio of the length between the spot and nitrogen inlet-end of the tube and that between the spot and nitrogen outlet-end was set to be approximately 2:3. Nitrogen gas was flowed at the rate of 0.8 to 1.0 litter per minute through the fiber-growth run. The temperature was raised to 1050° C. at a rate of 50° C./hr, whereby the mixture was melted and $SnO_2$ was evaporated. The system was maintained under these conditions for 4 days, whereby stannic oxide fibers grew on the inner wall of the tube, keeping apart from the boat and toward the direction of the nitrogen flow. Five days later, the temperature was gradually lowered to room temperature, and the stannic oxide fibers were taken out.

The stannic oxide fibers thereby obtained had a diameter of about 1 μm and a length of about 3 mm. The electrical conductivity of the fibers was 100 Ωcm.

EXAMPLE 4

In the same manner as in Example 3, similar stannic oxide fibers were likewise obtained when a tin-copper alloy (Sn: 50 wt. %) was used instead of tin alone.

EXAMPLE 5

Fifteen g of stannic oxide of 99.99% purity, 0.25 g of antimony pentoxide having a purity of 99.99% and 100 g of tin of a purity of 99.99% were mixed. An alumina boat containing the above mixture was introduced into a mullite reaction tube which had been placed in a horizontal electric furnace. The boat was laid at the spot of the highest temperature gradient of the furnace. The ratio of the length between the spot and nitrogen inlet-end of the tube and that of the spot and nitrogen outlet-end was set to be approximately 2:3. Nitrogen gas was flowed at the rate of 0.8 to 1.0 liter per minute through the fiber-growth run. The temperature was raised to 1050° C. at a rate of 50° C./hr, whereby the mixture was melted and $SnO_2$ was evaporated. The system was maintained under these conditions for 4 days, whereby stannic oxide fibers grew on the inner wall of the tube, keeping apart from the boat and toward the direction of the nitrogen flow. Five days later, the temperature was gradually lowered to room temperature, and the stannic oxide fibers were taken out.

The stannic oxide fibers thereby obtained had a diameter of about 1 μm and a length of about 3 mm. The electrical conductivity of the fibers was 100 Ω.cm.

EXAMPLE 6

Electrically conductive stannic oxide fibers were obtained in the same manner as in Example 5 except that a tin-zinc alloy (tin: 90%) was used instead of tin. The obtained fibers were substantially the same as the fibers obtained in Example 5.

EXAMPLE 7

Stannic oxide fibers were prepared in the same manner as in Example 5 except that 10 g of commercially available SnO and 2.5 g of $SnO_2$ doped with 10 molor % of antimony oxide were used instead of $SnO_2$ and antimony pentoxide in Example 5. The fibers thereby obtained and their electric conductivity were substantially the same as those of Example 5.

Thus, according to the present invention, it is possible to readily obtain tin oxide fibers or electrically conductive tin oxide fibers, which used to be difficult to obtain in a substantial amount.

What is claimed is:

1. A process for producing tin oxide fibers, which comprises forming a melt comprising a solute consisting essentially of tin oxide and a solvent selected from the group consisting of copper, a copper alloy, tin or a tin alloy, evaporating the solute from the melt, and introducing the evaporated solute to a low temperature zone, whereby tin oxide fibers to precipitate and grow in the low temperature zone.

2. The process according to claim 1, wherein the weight ratio of the solute to the solvent in the melt is from 20:80 to 2:98.

3. The process according to claim 1, wherein the melt is heated at a temperature within a range of from 500 to 1400° C. for the evaporation of the solute therefrom, and the low temperature zone is maintained at a temperature lower by from 50 to 500° C. than the temperature of the melt.

4. The process according to claim 1, which further comprises conducting the process steps in a non-oxidizing atmosphere.

5. The process according to claim 1, wherein the solute further contains a metal or metal oxide in addition to the tin oxide and said solvent to increase the electrical conductively of tin oxide.

6. The process according to claim 1, wherein the solvent is a copper alloy, which copper alloy is an alloy of copper with a metal which provides an alloy having a lower melting point than copper.

7. The process according to claim 1, wherein the solvent is a copper alloy, which copper alloy is an alloy of copper with tin or zinc.

8. The process according to claim 1, wherein the solvent is a tin alloy, which tin alloy is an alloy of tin with copper or zinc.

9. The process according to claim 1, wherein the tin oxide fibers produced have uniform diameters.

* * * * *